United States Patent [19]
Kimura et al.

[11] Patent Number: 5,843,229
[45] Date of Patent: Dec. 1, 1998

[54] CRYSTAL HOLDING APPARATUS

[75] Inventors: Masanori Kimura; Eiichi Iino; Hirotoshi Yamagishi; Kiyotaka Takano, all of Annaka, Japan

[73] Assignee: Shin-Etsu Handotai Co., Ltd., Tokyo, Japan

[21] Appl. No.: 763,889

[22] Filed: Dec. 11, 1996

[30] Foreign Application Priority Data

Dec. 27, 1995 [JP] Japan .................................... 7-351275

[51] Int. Cl.$^6$ .................................................. C30B 35/00
[52] U.S. Cl. .......................................... 117/218; 117/208
[58] Field of Search .................................. 117/200, 201, 117/202, 208, 210, 218

[56] References Cited

U.S. PATENT DOCUMENTS

| | | | |
|---|---|---|---|
| 4,186,123 | 1/1980 | Jericho et al. | 117/911 |
| 4,190,630 | 2/1980 | Apilat et al. | 117/218 |
| 4,738,832 | 4/1988 | Drechsel | 117/218 |
| 5,126,113 | 6/1992 | Yamagishi et al. | 117/218 |
| 5,173,270 | 12/1992 | Kida et al. | 117/218 |

FOREIGN PATENT DOCUMENTS

| | | |
|---|---|---|
| 0 286 133 A1 | 10/1988 | European Pat. Off. . |
| 0 369 626 A1 | 5/1990 | European Pat. Off. . |
| 0 449 260 A2 | 10/1991 | European Pat. Off. . |
| 62-288191 | 12/1987 | Japan . |
| 63-252991 | 10/1988 | Japan . |
| 3-285893 | 12/1991 | Japan . |
| 3-295893 | 12/1991 | Japan . |
| 405270974A | 10/1993 | Japan ..................................... 117/218 |

*Primary Examiner*—Felisa Garrett
*Attorney, Agent, or Firm*—Oliff & Berridge, PLC

[57] ABSTRACT

In a crystal holding apparatus, a stepped engagement portion of a single crystal formed below a seed crystal is held by holding portions of a pair of lifting jigs so as to be pulled up. A lock mechanism consisting of a hook lever and an engagement pin is provided in order to prevent the closed lifting jigs from opening. Further, a portion of each holding portion to be contacted with a crystal is provided with a swing claw which is swingable about a horizontal pin. Accordingly, it becomes possible to reliably hold the crystal, to prevent generation of a defect in the crystal structure, and to prevent a material melt from being contaminated.

18 Claims, 7 Drawing Sheets

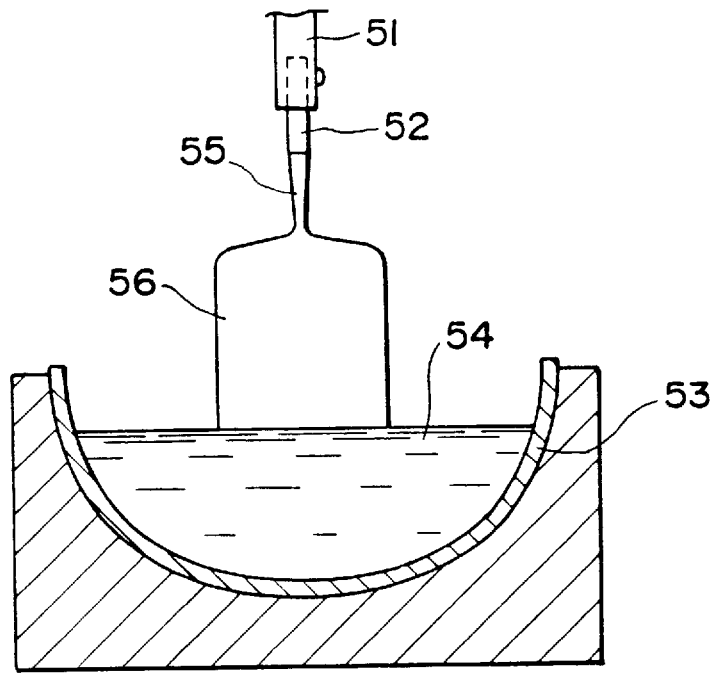
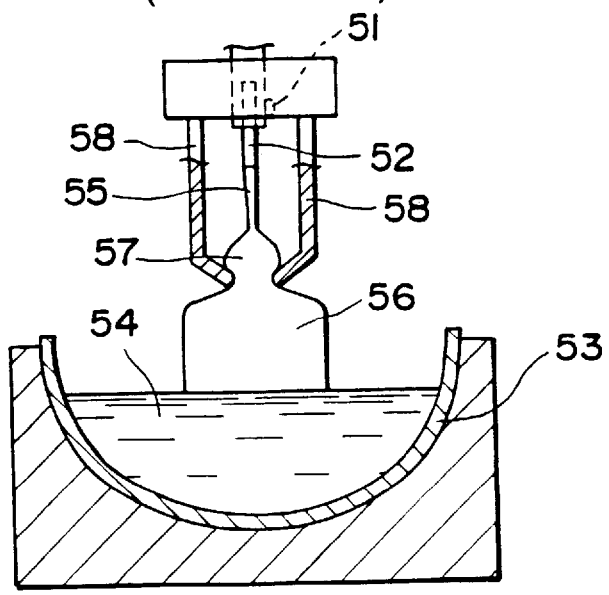

CRYSTAL HOLDING APPARATUS

BACKGROUND OF THE INVENTION

1. Field of the Invention

The present invention relates to an improvement on a crystal holding apparatus for holding a stepped engagement portion of a single crystal in a crystal pulling apparatus which employs the Czochralski method.

2. Description of the Related Art

FIG. 6A shows an example of a conventionally known method for producing a semiconductor material such as silicon. In the method of FIG. 6A, a seed crystal 52 held by a seed chuck 51 is brought into contact with the surface of a material melt 54 in a crucible 53 and is subsequently pulled and rotated while a pulling rate is adjusted, to thereby form a neck portion 55 at the lower portion of the seed crystal 52; subsequently, a straight cylindrical portion 56 of a single crystal having a larger diameter is formed by continuous pulling. In this case, as a result of the neck portion 55 being formed, the straight cylindrical portion 56, which is formed below the neck portion 55, becomes free of dislocations to thereby improve quality of an obtained single crystal. In recent years, because of a tendency toward larger diameters of a single crystal or due to pursuit of the improvement of production efficiency, the weight of a formed single crystal has been increased, resulting in a potential insufficiency of strength of the neck portion 55. Concretely, the diameter of the neck portion which leads to a dislocation free of the straight cylindrical portion 56 is usually 3 mm or less, and such a neck portion as having a diameter of 3 mm can certainly support only a single crystal of at most about 88 kg in weight. However, an 8-inch-diameter single crystal which is desired in recent years has a cylindrical portion 56 being 120 cm in length, and the weight exceeding 88 kg. Accordingly, in order to certainly support such a high-weight single crystal, a method and apparatus as shown in FIG. 6B have been employed.

The apparatus shown in FIG. 6B is adapted to form a stepped engagement portion 57, which is composed of an expanded-diameter portion and a reduced-diameter portion, between the neck portion 55 and the cylindrical portion 56, so that lifting jigs 58 hold the stepped engagement portion 57 to thereby pull a single crystal. Examples of such a technique are disclosed in Japanese Patent Application Laid-Open (kokai) Nos. 62-288191, 63-252991, 3-285893, and 3-295893. According to Japanese Patent Application Laid-Open (kokai) No. 3-285893, when a stepped engagement portion, which is formed during the pulling of a seed crystal, reaches holding levers disposed at a predetermined position, the holding levers hold the stepped engagement portion so as to pull a single crystal.

However, the above-described conventional holding apparatus has the following problems. First, for example, as shown in FIG. 7, as the weight W of a crystal increases, a force P (P=Wsinθ·cosθ), which acts on a lifting jig in a direction to open the lifting jig, increases. Moreover, the lifting jigs are exposed to high-temperature radiant heat from the surface of a melt. This is disadvantageous to the strength of the lifting jigs.

In order to cope with this problem, if the lifting jigs are designed to be robust so as to reliably maintain the lifting jigs in a closed state, the weight of the lifting jigs themselves will increase, resulting in an increase in the size of a pulling mechanism as well as in an error in control of a pulling rate.

Second, since the surface of the stepped engagement portion, which is held by the holding portions of the lifting jigs, is usually curved in a vertical direction, each of the holding portions contacts the stepped engagement portion at a single point in a vertical direction, and thus while a single crystal is being pulled, a stress concentrates within the stepped engagement portion at the section of contact with the holding portion. As a result, dislocation are likely to generate readily in the growing single crystal being at high-temperature. This may cause the stepped engagement portion to break at the section of contact with the holding portion, causing the single crystal to drop.

Even when the surface of the contact section of the holding portion is curved for better contact with the stepped engagement portion of a single crystal, the curved surface fails to match that of an actually formed stepped engagement portion. That is, this problem cannot be solved merely by changing the shape of the surface of the contact section.

Third, in order to open/close the holding portions of the lifting jigs, the lifting jigs must be driven through their driving portions such that they slide or swing at sliding portions or swinging portions. The driving portions and the sliding portions or swinging portions of the lifting jigs are usually disposed at the upper portion of the lifting jigs, and are highly likely to generate metallic powder due to surface contact at those sliding or swinging portions. When such metallic powder drops into a material melt, a defect may occur in the crystal structure, thus degrading reliability of a final electronic device.

Accordingly, there has been a demand for measures to prevent the lifting jigs for holding a stepped engagement portion of a single crystal from opening easily even when a large load is applied to the lifting jigs, to disperse stress which occurs within the stepped engagement portion at the section of contact with the holding portion of each lifting jig, and to prevent a material melt from being contaminated with metallic powder which is generated in the sliding portion or the like of the lifting jig.

SUMMARY OF THE INVENTION

The present invention has been accomplished to solve the above-mentioned problems, and an object of the present invention is to provide a crystal holding apparatus which can reliably hold a crystal, which can prevent generation of a defect in the crystal structure, and which can prevent a material melt from being contaminated.

The present invention provides a crystal holding apparatus including a pair of lifting jigs which have holding portions and adapted to hold through the holding portion a stepped engagement portion formed between a seed crystal and a straight cylindrical portion of a single crystal during a process of growing the single crystal by rotating and pulling the seed crystal after the seed crystal is brought into contact with a material melt. The lifting jigs are provided with a lock mechanism for preventing the holding portions from opening apart The lock mechanism may employ, for example, a mechanical lock system in which a hook member provided on one lifting jig is hooked onto an engagement pin provided on the other lifting jig, to thereby reliably prevent the lifting jigs from opening apart.

Accordingly, even when a single crystal having a heavier weight is to be formed, the single crystal can be reliably held by the holding portions, thereby preventing an accidental drop of the single crystal.

Preferably, an unlock mechanism is further provided so as to unlock the lock mechanism at an arbitrary point of time.

This unlock mechanism may include a wire for moving the hook member.

Accordingly, when a single crystal being pulled must be melted again due to the generation of dislocations, the lock mechanism can be immediately unlocked to release the single crystal.

The present invention provides another crystal holding apparatus including a pair of lifting jigs which have holding portions and adapted to hold through the holding portions a stepped engagement portion formed between a seed crystal and a straight cylindrical portion of a single crystal during a process of growing the single crystal by rotating and pulling the seed crystal after the seed crystal is brought into contact with a material melt This crystal holding apparatus includes means for opening and closing the lifting jigs on respective slide surfaces, and a stepped portion formed on one of the slide surfaces. When one of the lifting jigs slide along the stepped portion, the holding portion of one lifting jig vertically moves relative to the holding portion of the other lifting jig. Moreover, there are provided a pin which projects upward or downward from one of the holding portions, and a pin hole which is formed in the other holding portion and adapted to fit onto the pin from the upper or lower side of the pin.

In this crystal holding apparatus, when the lifting jigs are slid in respective inward holding directions, the holding portion of one lifting jig is partially overlaid with that of another lifting jig to thereby fit the pin of the holding portion into the pin hole in the other holding portion. As a result of engagement of the pin and the pin hole, the holding portions are prevented from opening apart. When lifting jigs are slid in respective outward opening directions, the engagement between the pin and the pin hole is canceled.

Accordingly, the lifting jigs can be locked without providing a separate lock mechanism. Moreover, the operation becomes easier because no locking operation is required.

Preferably, each of the holding portions is provided with a swing claw which is located at a portion to be contacted with the stepped engagement portion of the crystal and which is pivotable about a horizontal axis.

When the swing claw contacts the stepped engagement portion of a single crystal to hold the stepped engagement portion, the swing claw pivots about the horizontal axis so as to fit to the curved surface of the stepped engagement portion, so that the stepped engagement portion can be supported at two or more points along a vertical direction. Thus, stress induced within the stepped engagement portion due to the contact is dispersed, thereby preventing the generation of dislocations, breakage of the supported portion of a single crystal, and like risks.

Also, as a result of the stepped engagement portion of a single crystal being held at two or more points along a vertical direction, vibration of the single crystal can be suppressed.

Preferably, the holding portions are provided at the lower portion of the lifting jigs, driving portions and sliding portions of the lifting jigs are disposed at the upper portions of the lifting jigs, and a shield member is disposed between the driving and the sliding portions and the holding portions so as to separate them from each other. This structure prevents generated metallic powder from dropping into the material melt.

Preferably, the pressure in the space above the shield member is maintained lower than that in the space below the shield member. This further reduces the risk of metallic powder dropping into the space below the shield member.

Preferably, the lifting jigs are moved by a lifting drive source and are surrounded by a bellows chamber, which extends and contracts in a vertical direction in accordance with the vertical movement of the lifting jigs; and a heat shield cylinder, which is extendible and contractible in the vertical direction, is disposed inside the bellows chamber. In this case, the bellows chamber can be protected from radiant heat to thereby improve durability of the bellows chamber.

That is, the driving portions, etc. of the lifting jigs are liable to generate metallic powder by surface-contacting the sliding, rotating, swinging surfaces, etc. Also, in the driving portions, the possibility of generating metallic powder, for example, in the connection portion between a cylinder rod and the lifting jig is high. Therefore, these portions are disposed above the material melt so as to be wide apart from the material melt and in addition they are separated from each other by the shield member so as to prevent the generated metallic powder from dropping into the material melt by the shield member. Furthermore, if the pressure in the space above the shield member in which the possibility of generating metallic powder is high is reduced, the possibility that the generated metallic powder drops into the material melt below the shield member can be further reduced.

In case where a heat shield member is used as a shield member so that radiant heat below the shield member is prevented from be transferred to the driving and sliding portions above the shield member, the durability thereof can be improved as well as the generation of metallic powder therefrom can be effectively prevented, but in addition, if a heat shield cylinder is simultaneously disposed inside the bellows chamber, the bellows chamber is protected from radiant heat so that the durability of the bellows chamber can be also improved.

BRIEF DESCRIPTION OF THE DRAWINGS

FIG. 6A is a view showing a conventional method for pulling a single crystal;

FIG. 6B is a view showing a conventional method for holding a single crystal.

DESCRIPTION OF THE PREFERRED EMBODIMENTS

Embodiments of the present invention will now be described in detail with reference to the drawings.

Figure 1:
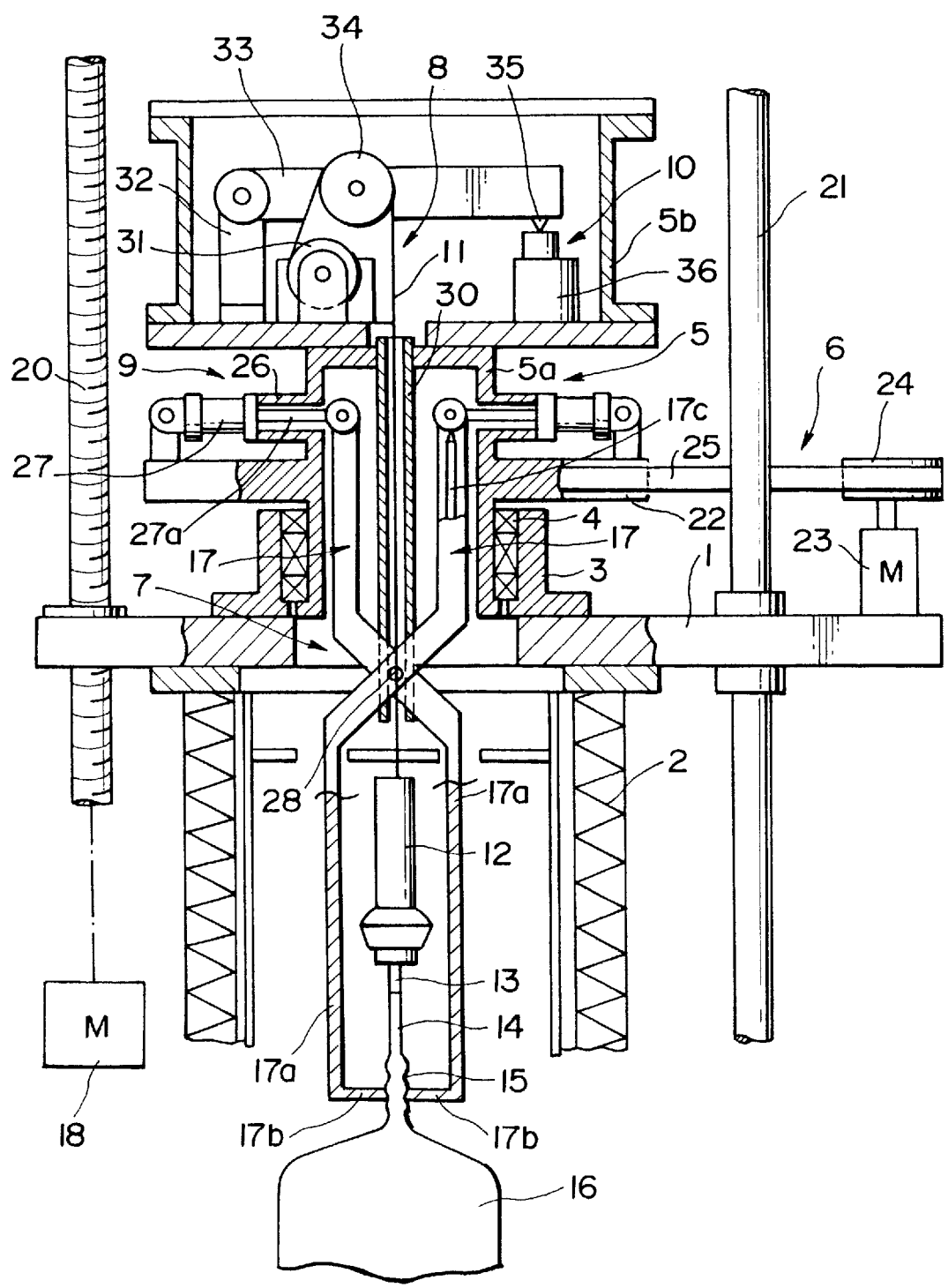
FIG. 1 is a view showing the entire structure of a crystal pulling apparatus.

A crystal holding apparatus of the present invention is used in a crystal pulling apparatus for forming, for example, a silicon crystal for use as a semiconductor material by the Czochralski method, and is particularly suited for safely producing a heavy single crystal without dislocations being induced. First, the basic structure of a crystal pulling apparatus will be described with reference to FIG. 1.

The crystal pulling apparatus includes a lower chamber (not illustrated) for accommodating a crucible (not illustrated), a lifting plate 1 disposed above the lower chamber while a predetermined space is provided between the lifting plate 1 and the lower chamber, and a bellows chamber 2 disposed between the lifting plate 1 and the lower chamber. A cylindrical rotation support member 3 is fixed on the top of the lifting plate 1. A case 5 is disposed within the rotation support member 3 such that it can rotate on a bearing 4 about a vertical axis.

The case 5 includes a lower case 5a and an upper case 5b, which are integrally connected to each other. The lower case 5a is provided with a rotational mechanism 6 and a lifting-jig drive mechanism 9, which is part of a crystal holding apparatus 7. The upper case 5b accommodates a wire pulling mechanism 8 and a load measuring mechanism 10.

A seed chuck 12 for holding a seed crystal 13 is attached to the lower end of a wire 11 such that when the bottom end of the seed crystal 13 is brought into contact with a material melt in a crucible and is subsequently pulled so as to grow a single crystal, a neck portion 14 is formed to prevent dislocations from being generated within a formed single crystal before a straight cylindrical portion 16 of the single crystal is formed. In this case, the crystal holding apparatus 7 is adapted to hold a stepped engagement portion 15 located between the neck portion 14 and the straight cylindrical portion 16 through use of lifting jigs 17 and 17 to thereby pull a single crystal.

A ball screw 20, which is rotated by a lift drive motor 18, is engaged with the lifting plate 1, and a guide shaft 21 is slidably passed through the lifting plate 1. When the ball screw 20 rotates, the lifting plate 1 moves vertically while maintaining a horizontal posture.

The structures of the above-described various portions will now be described in detail.

The bellows chamber 2 is made of a metallic plate of stainless steel, titanium, or like metal. The metallic plate is folded in the form of bellows chamber so that the bellows chamber 2 can expand/contract in a vertical direction. The bellows chamber 2 communicates with the lower chamber (not illustrated) and isolates the interior of the crystal pulling apparatus from the outside air. The bellows chamber 2 expands as a single crystal is pulled. Also, the expandable and contractible characteristic of the bellows chamber 2 is utilized when a final product of a single crystal is taken out of the crystal pulling apparatus.

The rotational mechanism 6 is used to rotate the case 5 about a vertical axis, and includes a large-diameter pulley 22, a motor 23, a small-diameter pulley 24, and an endless belt 25. The large-diameter pulley 22 is integrally and externally provided at an intermediate portion of the lower case 5a. The motor 23 is fixed on the upper face of the lifting plate 1 such that it is located at one end thereof.

The small-diameter pulley 24 is attached to the output shaft of the motor 23. The endless belt 25 is disposed to extend between the large-diameter pulley 22 and the small-diameter pulley 24. Thus, as the motor 23 rotates, the case 5 rotates.

The crystal holding apparatus 7 includes the lifting-jig drive mechanism 9 and a pair of right and left lifting jigs 17.

The lifting-jig drive mechanism 9 includes two oil hydraulic cylinder units 27, which are fixed onto corresponding right and left hollow bosses 26 of the lower case 5a. The upper end portion of each lifting jig 17 is pivotally attached to the end of a rod 27a of each hydraulic cylinder unit 27. Arm portions 17a of the lifting jigs 17 extend downward, and their intermediate portions cross one another at a pivot 28. Thus, as the pistons of the oil hydraulic cylinder units 27 advance and retreat, holding portions 17b, which are formed at the bottom ends of the arm portions 17a, open and close along an arc, which is curved with respect to the pivot 28.

A guide tube 30 is vertically disposed within the lower case 5a along the center axis of the case 5a, and a wire 11 extends within the guide tube 30.

The wire pulling mechanism 8 includes a wire winding pulley 31, which is mounted on the bottom plate of the case 5b; a lever 33, which is pivotably cantilevered onto a support 32 standing on the bottom plate; and a guide pulley 34, which is pivotably supported by the intermediate portion of the lever 33. The wire 11 is wound onto the wire winding pulley 31 via the guide pulley 34. The wire 11 is wound up by so rotating the wire winding pulley 31.

The load measuring mechanism 10 includes a pivot 35 and a load cell 36. The pivot 35 is located at the tip end of the lever 33. The load cell 36 supports the pivot 35. The thus-structured load measuring mechanism 10 measures a load applied to the guide pulley 34, which load has a predetermined ratio to the weight of the crystal.

In the crystal pulling apparatus having the above-described structure, the seed crystal 13 attached to the tip end of the wire 11 is brought into contact with a material melt in a crucible (not shown), and subsequently the wire 11 is pulled at a predetermined speed by the wire winding mechanism 8 while the motor 23 of the rotary mechanism 6 is driven thereby to gently rotate the case 5, so as to grow a single crystal below the seed crystal 13. In the growth of a single crystal, the neck portion 14 is first formed, and then the stepped engagement portion 15 is formed and finally the straight cylindrical portion 16 is formed. In this case, the holding portions 17b of the right and left lifting jigs 17 are initially opened. When the stepped engagement portion 15, which is located between the neck portion 14 and the straight cylindrical portion 16, approaches the holding portions 17b during the pulling of the single crystal, the approach is detected by a sensor (not illustrated). As a result, the right and left oil hydraulic cylinder units 27 of the lifting-jig drive mechanism 9 are operated so as to hold the stepped engagement portion 15 by means of the holding portions 17b.

When the stepped engagement portion 15 is held by the holding portions 17b, the wire pulling mechanism 8 stops pulling the wire 11, and the lift drive motor 18, in turn, starts running so as to raise the lifting plate 1, thereby pulling the single crystal by means of the lifting jigs 17. As the lifting plate 1 rises, the surrounding bellows chamber 2 is expanded.

In the crystal pulling apparatus as described above, the lifting jigs 17 of the crystal holding apparatus 7 are exposed to radiant heat from a material melt located therebelow. This is disadvantageous to the strength of the lifting jigs 17. Moreover, particularly, when a heavier single crystal is to be grown, a greater force acts on the holding portions 17b in a direction to open them. Thus, it is necessary to take measures to reliably hold the single crystal.

Figure 2:
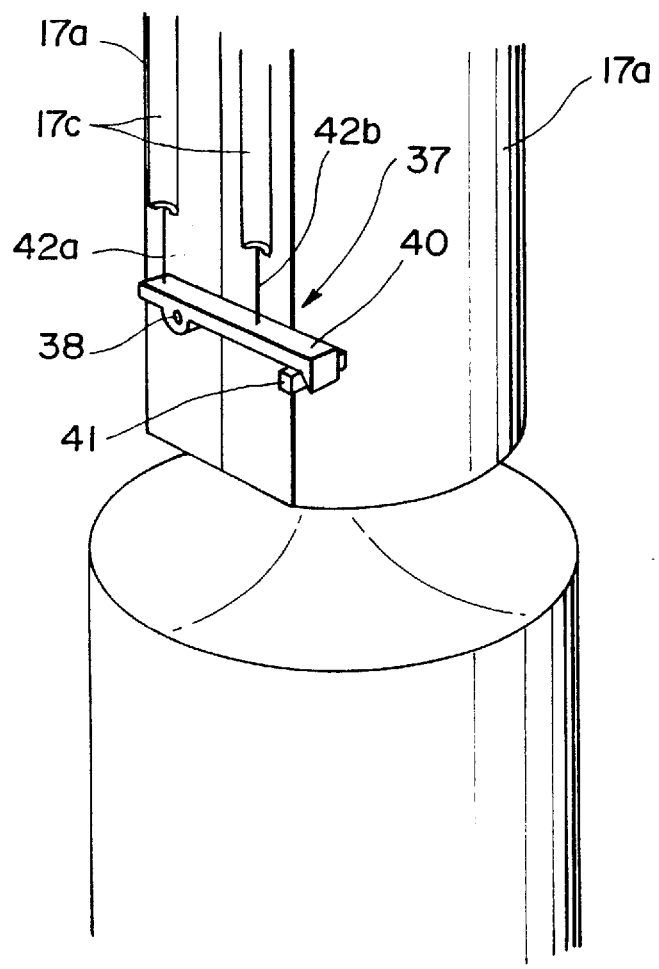
FIG. 2 is a view showing the structure of a lock mechanism according to the present invention.

FIG. 2 shows a lock mechanism 37 for preventing the holding portions 17b of the lifting jigs 17 from opening apart. The lock mechanism 37 includes a hook lever 40 and an engagement pin 41. The hook lever 40 is pivotably attached to the outer surface of the arm portion 17a of one lifting jig 17 through a pin 38 so as to swing vertically. The engagement pin 41 is attached to the outer surface of the arm portion 17a of the other lifting jig 17. Thus, the tip end of the hook lever 40 can be hooked onto the engagement pin 41.

Two wires 42a and 42b are attached to the hook lever 40 such that the pin 38 is located therebetween. Thus, when the wire 42a is pulled, the hook lever 40 swings so as to be hooked onto the engagement pin 41. On the other hand, when the wire 42b is pulled, the hook lever 40 is unhooked from the engagement pin 41. The wires 42a and 42b extend through respective guide pipes 17c, which are provided on the outer surface of one arm portion 17a, thereby suppressing the influence of generation of dust. The wires 42a and 42b are led out from the upper ends of the guide pipes 17c, which ends are located near the pivot of the rod 27a of the oil hydraulic cylinder unit 27 shown in FIG. 1. Also, a crank mechanism (not illustrated) is provided so that when either of the wires 42a and 42b is pulled up, the other wire is released.

When the holding portions 17b of the lifting jigs 17 are closed, the tip end of the hook lever 40 is hooked onto the engagement pin 41 to thereby prevent the holding portions 17b from opening apart. Also, for example, when a dislocation generates in a single crystal being pulled, the hook lever 40 is unhooked from the engagement pin 41 to thereby open the arm portions 17a apart in order to re-melt the single crystal.

A force which acts on the arm portions 17a in a direction to open them apart causes a tensile force to act on the hook lever 40. Normally, since metal, even at a high temperature, has a sufficiently strong tensile strength of not less than 1 ton, there is no risk of the arm portions 17a would opening.

Figure 3A:
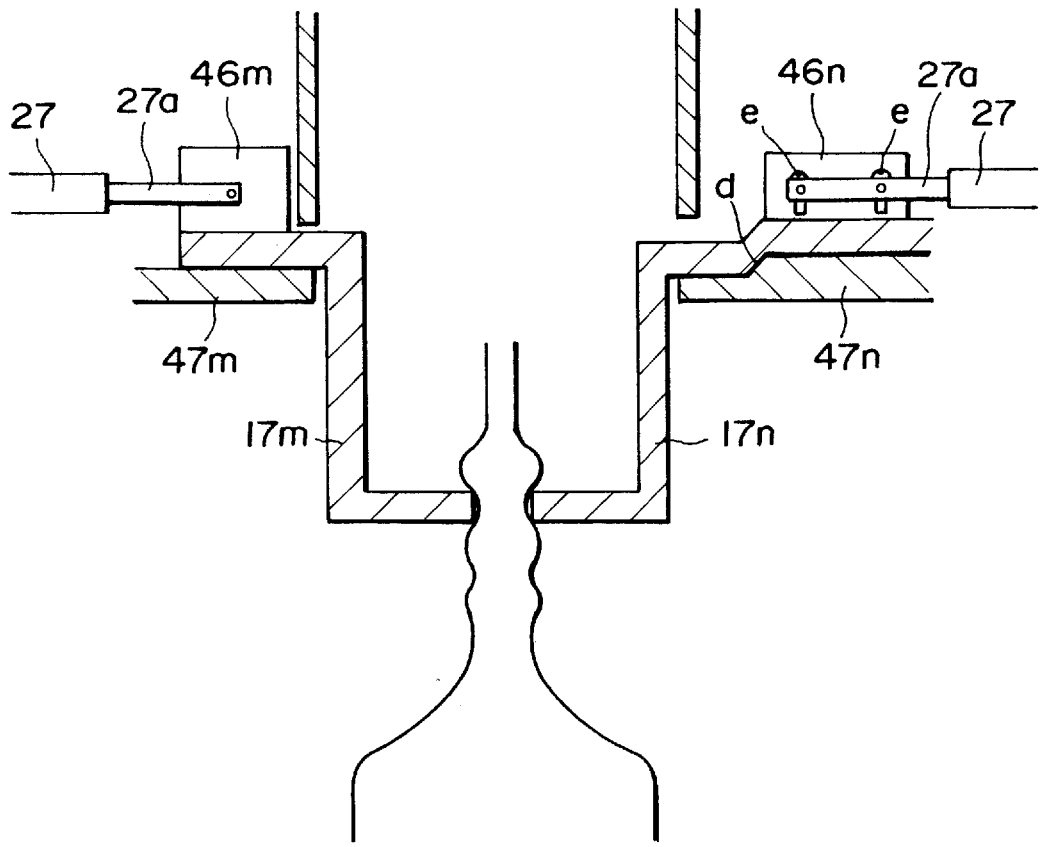
FIG. 3A is a vertical sectional view showing the structure of another lock mechanism according to the present invention for lifting jigs which are opened and closed by a different type of mechanism.
Figure 3B:
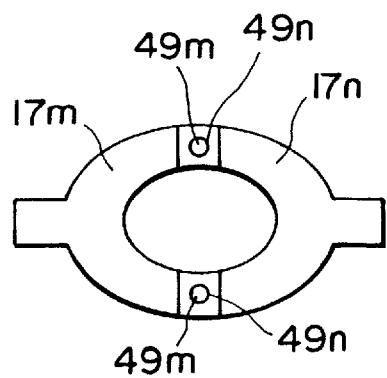
FIG. 3B is an enlarged view showing the holding portions of the lifting jigs shown in FIG. 3A.
Figure 3C:
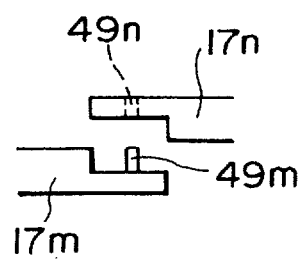
FIG. 3C is a view for illustrating the engagement of a pin and a pin hole.

The structure of another example of a lock mechanism for preventing the arm portions 17a and 17b from opening apart will next be described with reference to FIGS. 3A to 3C. In this example, the crystal holding apparatus 7 itself is modified such that the lifting jigs 17m and 17n slide laterally to open or close. The rods 27a of the oil hydraulic units 27 are linked to the upper ends of the lifting jigs 17m and 17n via coupling plates 46m and 46n, respectively, to thereby cause the lifting jigs 17m and 17n to slide laterally on slide surfaces 47m and 47n, respectively. Also, a stepped portion d is provided on the slide surface 47n.

Vertically elongated holes e are formed in the coupling plate 46n, which is located on the same side as is the stepped portion d, thereby permitting the lifting jig 17n to slide with moving vertically when the lifting jig 17n passes the stepped portion d. On the other hand, the opposite slide surface 47m is flat, so that the lifting jig 17m slides horizontally.

An end section of the holding portion of the lifting jig 17m is provided, for example, with an upward projecting pin 49m, while an end section of the holding portion of the other lifting jig 17n is provided with a pin hole 49n. When the right and left oil hydraulic cylinder units 27 cause the lifting jigs 17m and 17n to slide in a closing direction, the lifting jigs 17m and 17n approach one another such that the pin holes 49n lower toward the pins 49m. Subsequently, the pin holes 49n automatically fit onto the pins 49m as shown in FIG. 3B, to thereby lock the engagement of the lifting jigs 17m and 17n. When the lifting jigs 17m and 17n are opened apart, the pin holes 49n automatically disengage from the pins 49m.

Also, in this case, the closed lifting jigs 17m and 17n are reliably maintained in the closed state.

Of course, the pin 49m and the pin hole 49n may be replaced with each other, and the stepped portion d may be altered to a concave form.

Figure 7:
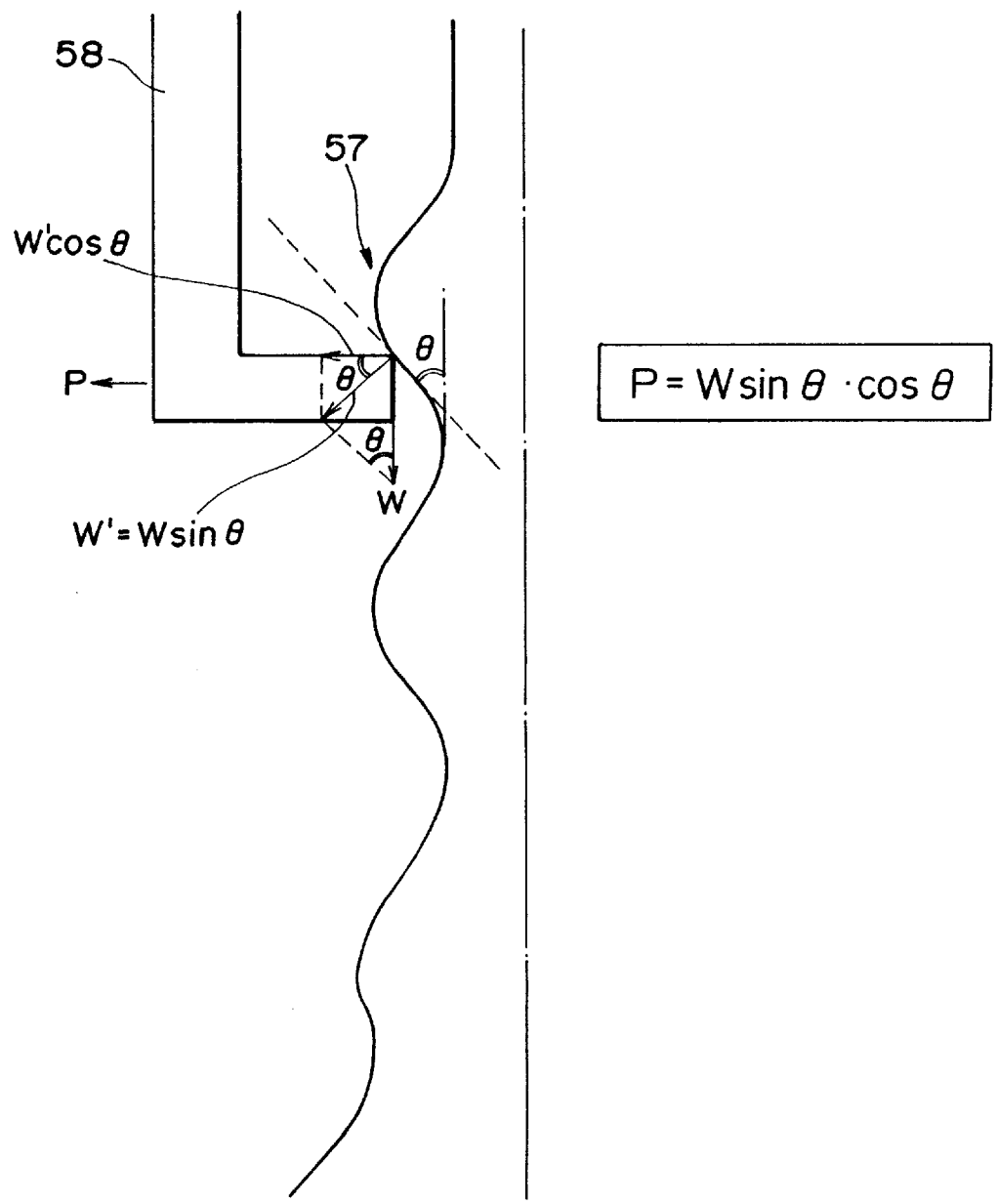
FIG. 7 is a diagram for illustrating the relationship between the weight (W) of a crystal and a force (P) which acts on a lifting jig in a direction to open the lifting jig.

When the stepped engagement portion 15 is held by the holding portions 17b (since the same is applied to the holding portions of the lifting jigs 17m and 17n of FIGS. 3A–3C, only the holding portion 17b is discussed below), the stepped engagement portion 15 is held only at one point along a vertical direction as shown in FIG. 7. Thus, there is a risk of dislocation within or breakage of a single crystal due to concentration of stress.

Figure 4A:
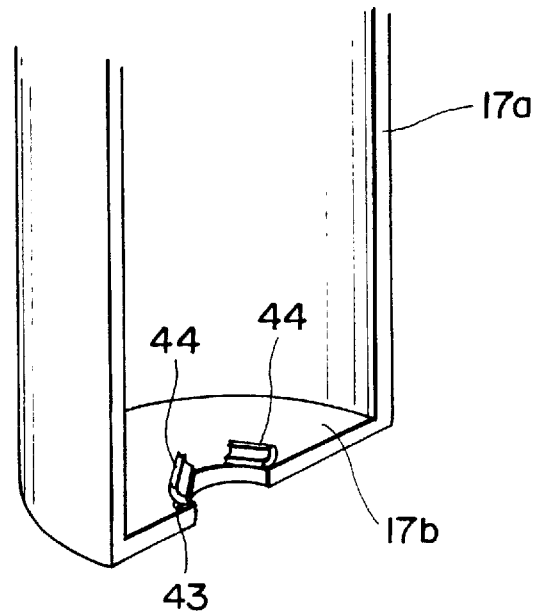
FIG. 4A is a perspective view showing the structure of a swing claw according to the present invention.
Figure 4B:
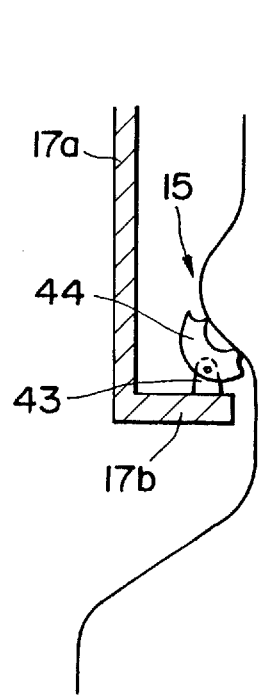
FIG. 4B is an explanatory view showing the state of holding the stepped engagement portion of a single crystal.

In view of this risk, as shown in FIG. 4A, the holding portions 17b are provided with swing claws 44, each of which is pivotable about a horizontal pin 43. As a result, the swing claws 44 pivot along a vertical plane so as to fit to the shape of the stepped engagement portion 15 as well as to support the stepped engagement portion 15 at two or more points along a vertical direction. When the swing claw 44 has a concaved contacting surface as shown in FIG. 4B, the stepped engagement portion 15 can be reliably supported at two or more points.

As the swing claw 44 having the above-described structure pivots along the vertical plane, the stepped engagement portion 15 can be supported at two or more points, thereby dispersing an induced stress within the stepped engagement portion 15 and holding stably the stepped engagement portion 15. Furthermore, vibration of a single crystal being formed can be suppressed.

In the crystal holding apparatus 7, metallic powder or like dust is likely to be generated at rotational portions and sliding portions. Particularly, such generation of metallic powder or the like dust occurs at the oil hydraulic cylinder unit 27, at the connection portions between the rods 27a and the lifting jigs 17, and at the arm portion pivot 28. If such metallic powder or the like drops into a material melt, a crystal defect will be induced. Also, when the above-described rotational portions and sliding portions are exposed to high-temperature heat, their durability will degrade, causing an increase in frequency of generation of metallic powder or the like.

Figure 5:
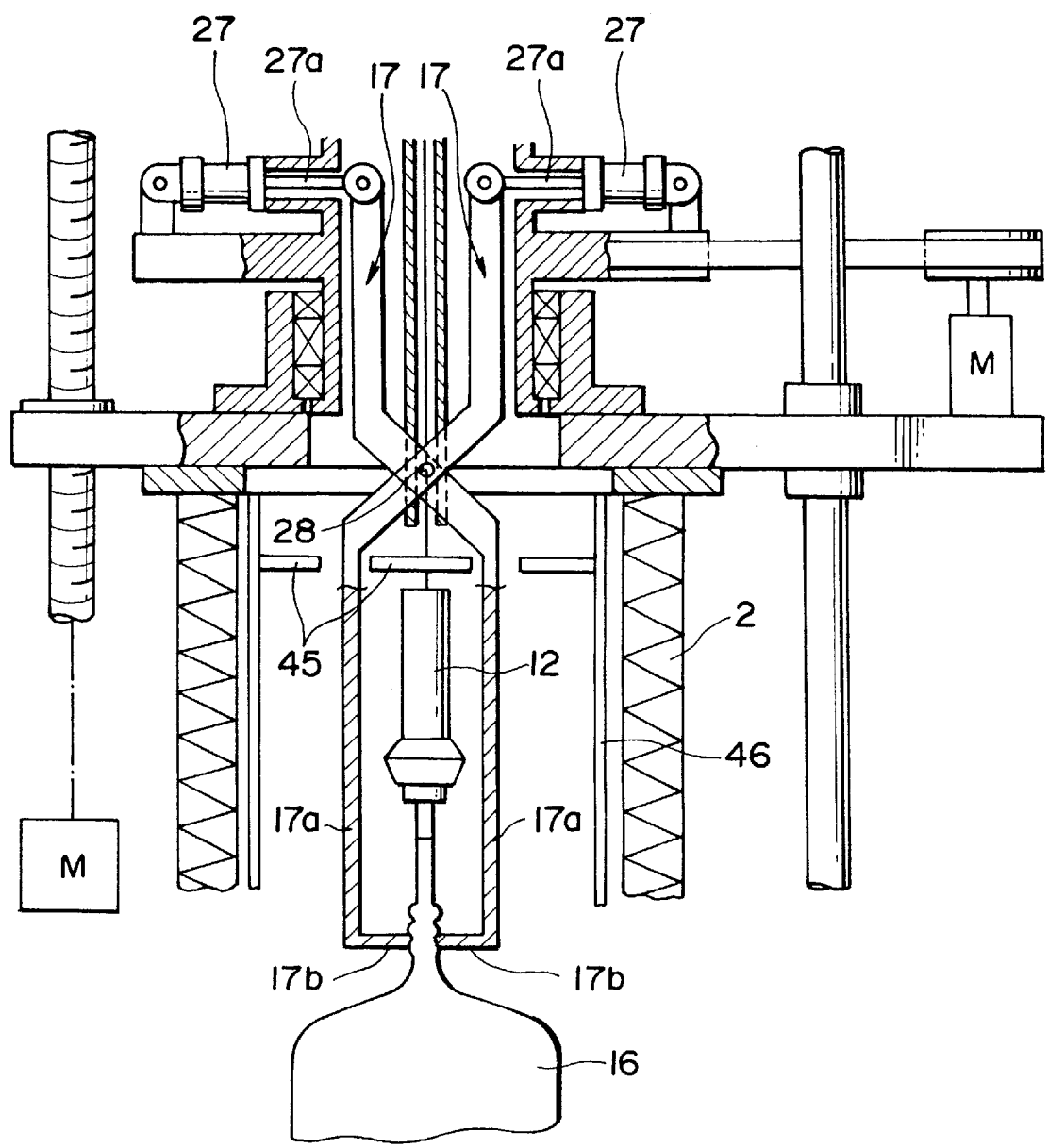
FIG. 5 is a view showing an example in which a shield member according to the present invention is disposed.

As shown in FIG. 5, in order to prevent metallic powder or the like, which is generated above a material melt, from dropping into the material melt, a shield plate 45 having heat shielding capability is disposed under the pivot 28 of the lifting jigs 17. The shield plate 45 reduces potential generation of metallic powder or the like stemming from exposure to heat radiated from the material melt, and prevents metallic powder or the like, if generated, from dropping into the material melt, thereby preventing deterioration of crystal quality.

When the shield plate 45 is to be applied to the lifting jigs of FIG. 3, the shield plate 45 is disposed so as to prevent metallic powder or the like which is generated, in particular, in the oil hydraulic cylinder units 27, the slide surfaces 47m and 47n and the like from dropping into the material melt.

In the present embodiment, the pressure in the space above the shield plate 45 is reduced to become lower than that in the space therebelow. Thus, it becomes possible to more effectively prevent metallic powder or the like, generated in the upper space, from entering the lower space.

Also, in the present embodiment, the shield plate 45 prevents heat generated therebelow from reaching thereabove, and an expandable thermal shield cylinder 46 is disposed inside the bellows chamber 2 thereby to protect the bellows chamber 2 from the heat.

The crystal holding apparatus 7 having the above-described structure according to the present invention can reliably hold even a heavier single crystal, and can simplify the mechanism for preventing the lifting jigs from opening.

Also, a single crystal can be held more stably. This prevents a portion to be actually held from being broken, thereby preventing an accidental drop of the single crystal.

Furthermore, metallic powder or the like, which is generated during opening/closing operation of the lifting jigs, is prevented from falling into a material melt.

Finally, members which are exposed to radiant heat from the material melt, such as, for example, the entire lifting jigs 17 and 17 or at least the arm portions 17a and the holding portions 17b, and in addition the hook lever 40, the slide surfaces 47m and 47n, the swing claws 44, the shield plate 45 and the thermal shield cylinder 46, are required to have heat resistance, so that such members are preferably made of heat-resistant materials such as tungsten, molybdenum or stainless steel, but may be made of other materials that have similar effects.

What is claimed is:

1. A crystal holding apparatus for holding a stepped engagement portion formed between a seed crystal and a straight cylindrical portion of a single crystal during a process of growing the single crystal by rotating and pulling the seed crystal after the seed crystal is brought into contact with a material melt, said crystal holding apparatus comprising:

a pair of lifting jigs having holding portions that hold the stepped engagement portion;

a lock mechanism that prevents the holding portions from opening apart; and an unlock mechanism that can unlock the lock mechanism at an arbitrary selected point of time during the process of growing the single crystal.

2. A crystal holding apparatus according to claim 1, wherein each of the holding portions includes a swing claw which is located to contact with the stepped engagement portion of the crystal and which is pivotable about a horizontal axis.

3. A crystal holding apparatus for holding a stepped engagement portion formed between a seed crystal and a straight cylindrical portion of a single crystal during a process of growing the single crystal by rotating and pulling the seed crystal after the seed crystal is brought into contact with a material melt, said crystal holding apparatus comprising:

a pair of lifting jigs having holding portions that hold the stepped engagement portion;

means for opening and closing said lifting jigs on respective slide surfaces;

a stepped portion formed on one of said slide surfaces such that when one of said lifting jigs slides along said stepped portion, the holding portion of said one of said lifting jigs moves vertically relative to the holding portion of the other lifting jig;

a pin projecting upwardly or downwardly from one of the holding portions; and a pin hole provided in the other holding portion that receives said pin from an upper or a lower side of said pin when the lifting jigs are closed, the pin being disengageable from the pin hole to open the lifting jigs and release the holding portions from the stepped engagement portion at a selected time during the process of growing the single crystal.

4. A crystal holding apparatus according to claim 4, wherein each of said holding portions includes a swing claw which is located to contact with the stepped engagement portion of the crystal and which is pivotable about a horizontal axis.

5. A crystal holding apparatus according to claim 3, wherein said holding portions are provided at a lower portion of said lifting jigs, said lifting jigs including driving portions and sliding portions disposed at upper portions of said lifting jigs, and the apparatus further comprising a shield member disposed between, and separating from each other, said driving portions and said sliding portions and said holding portions.

6. A crystal holding apparatus according to claim 5, wherein the pressure in a space above said shield member is maintained lower than the pressure in a space below said shield member.

7. A crystal holding apparatus according to claim 5, wherein said lifting jigs are vertically moved by a lifting drive source and are surrounded by a bellows chamber which extends and contracts vertically in accordance with the vertical movement of said lifting jigs; and the apparatus further comprising a heat shield cylinder which is vertically extendible and contractible and disposed inside said bellows chamber.

8. A crystal holding apparatus for holding a stepped engagement portion formed between a seed crystal and a straight cylindrical portion of a single crystal during a process of growing the single crystal by rotating and pulling the seed crystal after the seed crystal is brought into contact with a material melt, the seed crystal holding apparatus comprising a pair of lifting jigs each including:
an upper portion;
a lower portion;
a holding portion that holds the stepped engagement portion;
a driving portion disposed at the upper portion; and
a sliding portion disposed at the upper portion;

a shield member disposed between, and separating from each other, said driving portions and said sliding and said holding portions; and a lock mechanism that prevents the holding portions from opening apart.

9. A crystal holding apparatus according to claim 8, wherein the pressure in a space above said shield member is maintained lower than the pressure in a space below said shield member.

10. A crystal holding apparatus according to claim 8, wherein said lifting jigs are vertically moved by a lifting drive source and are surrounded by a bellows chamber, which vertically extends and contracts in accordance with the vertical movement of said lifting jigs; and further comprising a heat shield cylinder which is vertically extendible and contractible and disposed inside said bellows chamber.

11. A crystal holding apparatus for holding a stepped engagement portion formed between a seed crystal and a straight cylindrical portion of a single crystal during a process of growing the single crystal by rotating and pulling the seed crystal after the seed crystal is brought into contact with a material melt, said crystal holding apparatus comprising:

a pair of lifting jigs having holding portions that hold the stepped engagement portion;

a lock mechanism that prevents the holding portions from opening apart; and an unlock mechanism that can unlock the lock mechanism to enable the lifting jigs to pivotally open and release the holding portions from the stepped engagement portion at any selected time during the single crystal growing process.

12. The crystal holding apparatus of claim 11, wherein the unlock mechanism comprises means spaced from the lock mechanism for automatically actuating the unlock mechanism to unlock the lock mechanism at any selected time during the single crystal growing process.

13. The crystal holding apparatus of claim 12, wherein the unlock mechanism comprises:

a hook lever on one of the lifting jigs; and an engagement pin on the other lifting jig;

the hook lever engages the engagement pin to maintain the lifting jigs in a closed position in which the holding portions hold the stepped engagement portion, and the hook lever is selectively disengageable from the engagement pin to pivotally open the lifting jigs and release the holding portions from the stepped engagement portion during the process of growing the single crystal.

14. A crystal holding apparatus according to claim 13, wherein the holding portions are provided at a lower portion of the lifting jigs, the lifting jigs including driving portions and sliding portions disposed at upper portions of the lifting jigs, and the apparatus further comprising a shield member disposed between the driving portions and the sliding portions and the holding portions.

15. A crystal holding apparatus according to claim 14, wherein the pressure in a space above the shield member is maintained lower than the pressure in a space below the shield member.

16. The crystal holding apparatus of claim 12, wherein the unlock mechanism comprises:

a pin projecting from one of the holding portions; and a pin hole formed in the other holding portion;

the pin hole receives the pin when the lifting jigs are closed to maintain the lifting jigs in the closed position, and the pin is selectively disengageable from the pin hole to pivotally open the lifting jigs and release the holding portions from the stepped engagement portion during the process of growing the single crystal.

17. A crystal holding apparatus according to claim 16, wherein the holding portions are provided at a lower portion of the lifting jigs, the lifting jigs including driving portions and sliding portions disposed at upper portions of the lifting jigs, and the apparatus further comprising a shield member disposed between the driving portions and the sliding portions and the holding portions.

18. A crystal holding apparatus according to claim 17, wherein the pressure in a space above the shield member is maintained lower than the pressure in a space below the shield member.

* * * * *